US012750993B2

(12) United States Patent
Li-Diaz et al.

(10) Patent No.: US 12,750,993 B2
(45) Date of Patent: Sep. 29, 2026

(54) SYSTEMS AND METHODS FOR FASTENING COMPRESSION-ATTACHED MEMORY MODULE TO A CIRCUIT BOARD

(71) Applicant: Dell Products L.P., Round Rock, TX (US)

(72) Inventors: Kened Li-Diaz, Cedar Park, TX (US); Anthony W. Howard, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 86 days.

(21) Appl. No.: 18/921,740

(22) Filed: Oct. 21, 2024

(65) Prior Publication Data

US 2026/0113915 A1 Apr. 23, 2026

(51) Int. Cl.
*H05K 9/00* (2006.01)

(52) U.S. Cl.
CPC .................................. *H05K 9/0032* (2013.01)

(58) Field of Classification Search
CPC ........................... H05K 9/0032; H05K 9/0024
See application file for complete search history.

(56) References Cited

U.S. PATENT DOCUMENTS 10,649,503 B2 * 5/2020 Sahu ........................ G06F 1/182
12,526,969 B2 * 1/2026 Chauhan .............. H05K 9/0026
2026/0040453 A1 * 2/2026 Schnell .................... H05K 1/18

* cited by examiner

*Primary Examiner* — James Wu
(74) *Attorney, Agent, or Firm* — Jackson Walker L.L.P.

(57) ABSTRACT

An information handling system may include a circuit board, a shield base mounted to a surface of the circuit board, a compression connector housed within the shield base and placed on the surface, an information handling resource housed within the shield base and placed on the compression connector, and a shield cap mechanically coupled to the shield base to cause compressive mechanical force between the shield cap and the circuit board which in turn causes compressive mechanical force among the information handling resource, the compression connector, and the circuit board in order to electrically couple the information handling resource to the circuit board.

17 Claims, 4 Drawing Sheets

SYSTEMS AND METHODS FOR FASTENING COMPRESSION-ATTACHED MEMORY MODULE TO A CIRCUIT BOARD

TECHNICAL FIELD

The present disclosure relates in general to information handling systems, and more particularly to systems and methods for fastening a compression-attached memory module (CAMM) to a circuit board.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often include memory. Memory may broadly refer to hardware that stores information, such as data and programs, for immediate use by a processor of any information handling system. The term memory is often synonymous with the terms random access memory and main memory.

Memory is typically implemented using one or more memory modules. A type of memory module that has been increasing in use is a CAMM. A CAMM is a memory module form factor which uses a land grid array, which may be used in place of more traditional dual-inline memory modules (DIMMs) which use edge connectors. CAMM was created to overcome technical limitations of traditional slotted DIMMs. A CAMM module may allow for shorter traces on a motherboard PCB as compared to DIMMs, allowing the memory to be run with less power and at higher speeds. A CAMM may be pressed and held in place against a bar with land grid array pin contacts coupled to a motherboard.

Advantages of CAMMs include lower thickness, faster speeds, higher memory capacities, and higher memory bandwidth. However, existing CAMMs have disadvantages. One disadvantage arises from the fastening methodology used in existing CAMM implementations, which employs the memory module itself, a compression connector, and a backplate. When assembled, the motherboard is sandwiched between the compression connector and the backplate. The backplate and through-holes formed through the circuit board for mechanically coupling the backplate to the memory module and compression connector consume area on the circuit board that could otherwise be used for other components or signal routing.

SUMMARY

In accordance with the teachings of the present disclosure, the disadvantages and problems associated with existing approaches of fastening a CAMM to a circuit board may be reduced or eliminated.

In accordance with embodiments of the present disclosure, an information handling system may include a circuit board, a shield base mounted to a surface of the circuit board, a compression connector housed within the shield base and placed on the surface, an information handling resource housed within the shield base and placed on the compression connector, and a shield cap mechanically coupled to the shield base to cause compressive mechanical force between the shield cap and the circuit board which in turn causes compressive mechanical force among the information handling resource, the compression connector, and the circuit board in order to electrically couple the information handling resource to the circuit board.

In accordance with these and other embodiments of the present disclosure, an assembly may include a shield base configured to mount to a surface of a circuit board, house a compression connector within the shield base, and house an information handling resource within the shield base, and a shield cap configured to mechanically couple to the shield base to cause compressive mechanical force between the shield cap and the circuit board to cause compressive mechanical force among the information handling resource, the compression connector, and the circuit board in order to electrically couple the information handling resource to the circuit board.

In accordance with these and other embodiments of the present disclosure, a method may include mounting a shield base to a surface of a circuit board, the shield base configured to house a compression connector within the shield base, house an information handling resource within the shield base, and mechanically couple to a shield cap to cause compressive mechanical force between the shield cap and the circuit board to cause compressive mechanical force among the information handling resource, the compression connector, and the circuit board in order to electrically couple the information handling resource to the circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
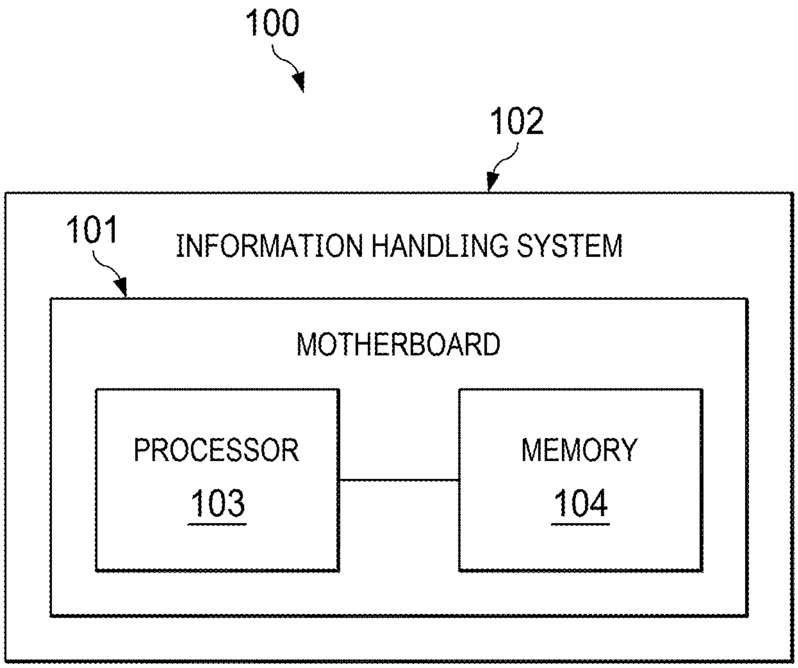
FIG. 1 illustrates a block diagram of selected components of an example information handling system, in accordance with embodiments of the present disclosure.
Figure 2A:
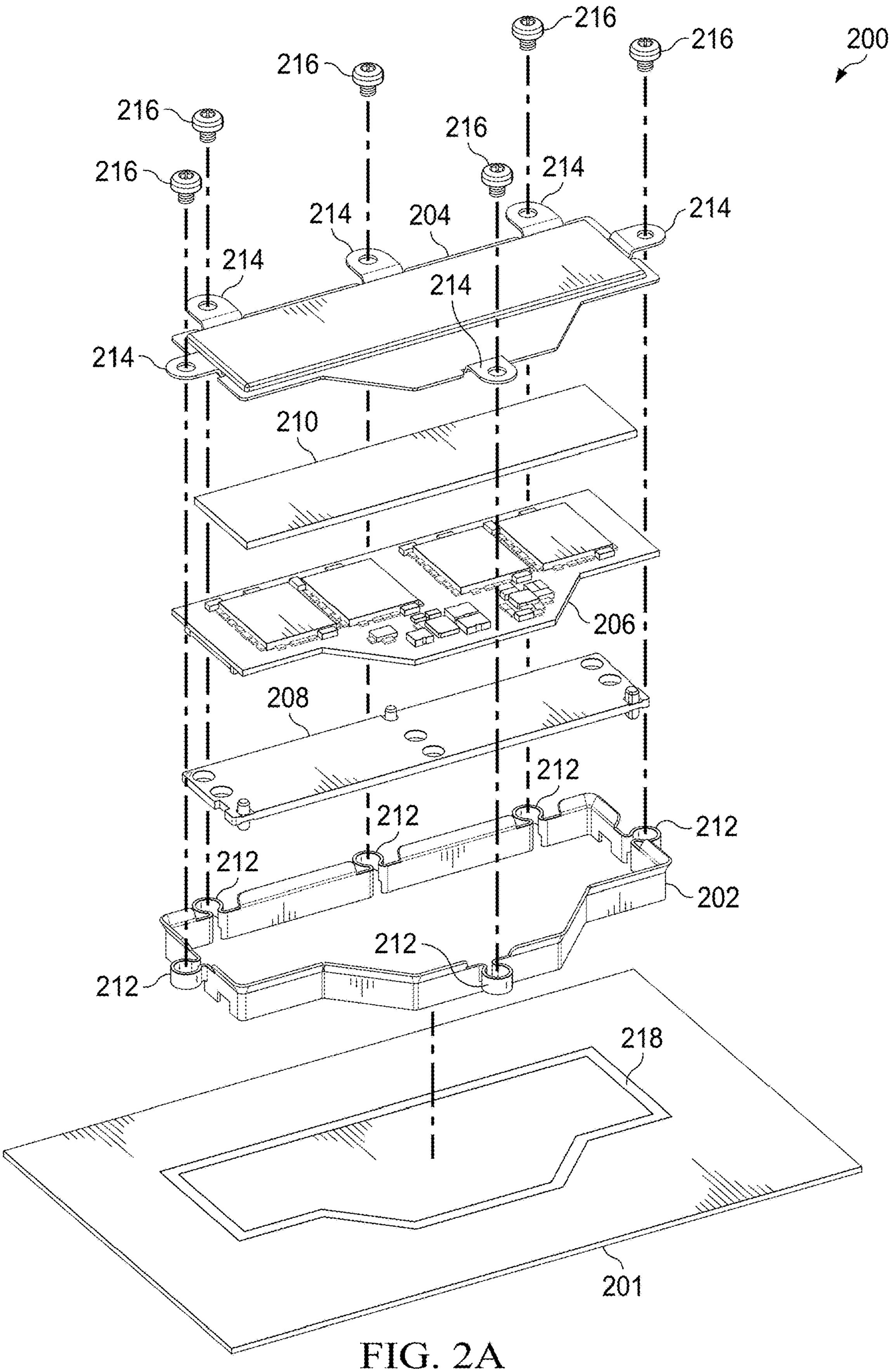
FIG. 2A illustrates an isometric exploded view of a CAMM assembly, in accordance with embodiments of the present disclosure.
Figure 2B:
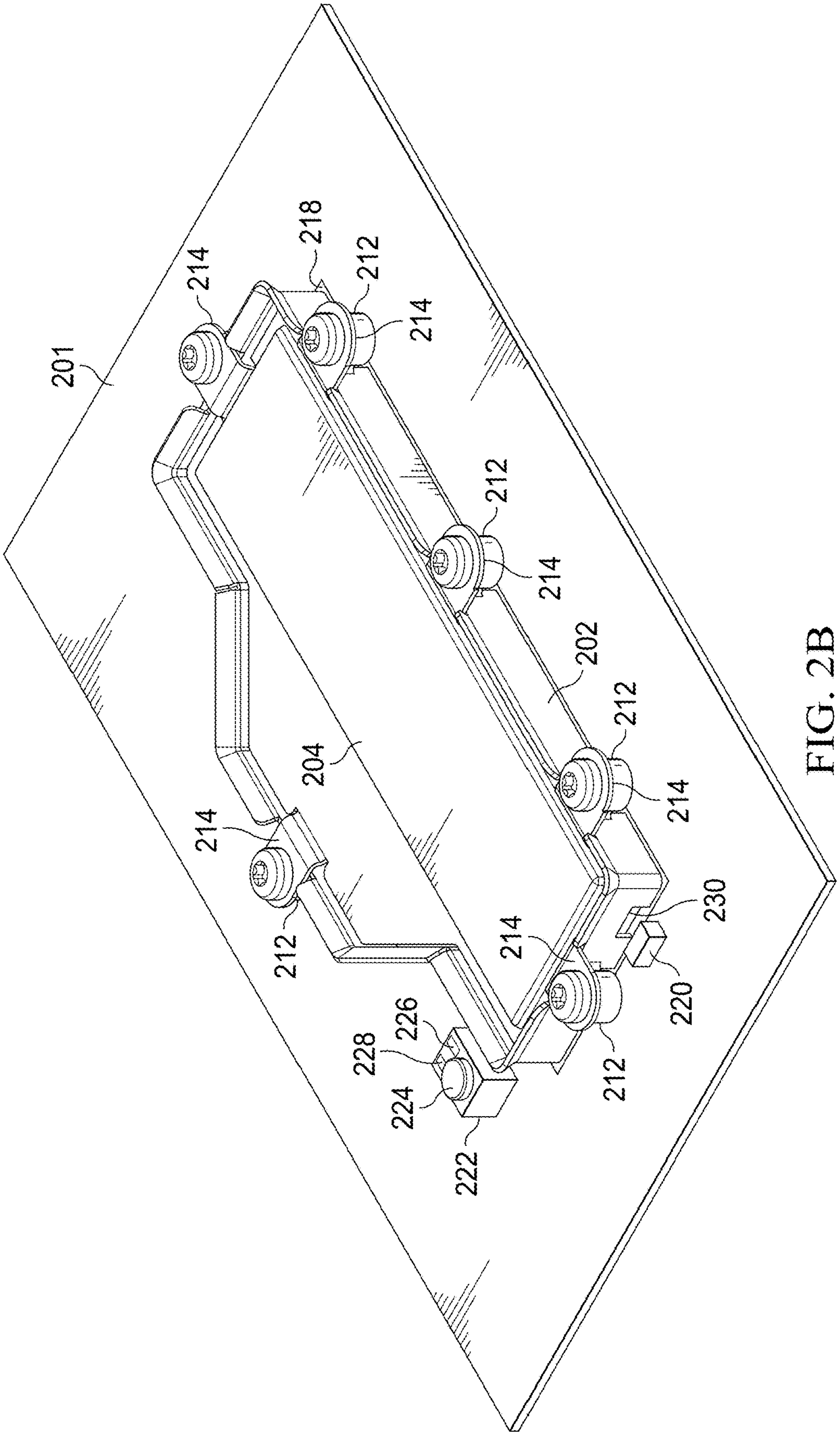
FIG. 2B illustrates an isometric assembled view of the CAMM assembly shown in FIG. 2A, in accordance with embodiments of the present disclosure.
Figure 2C:
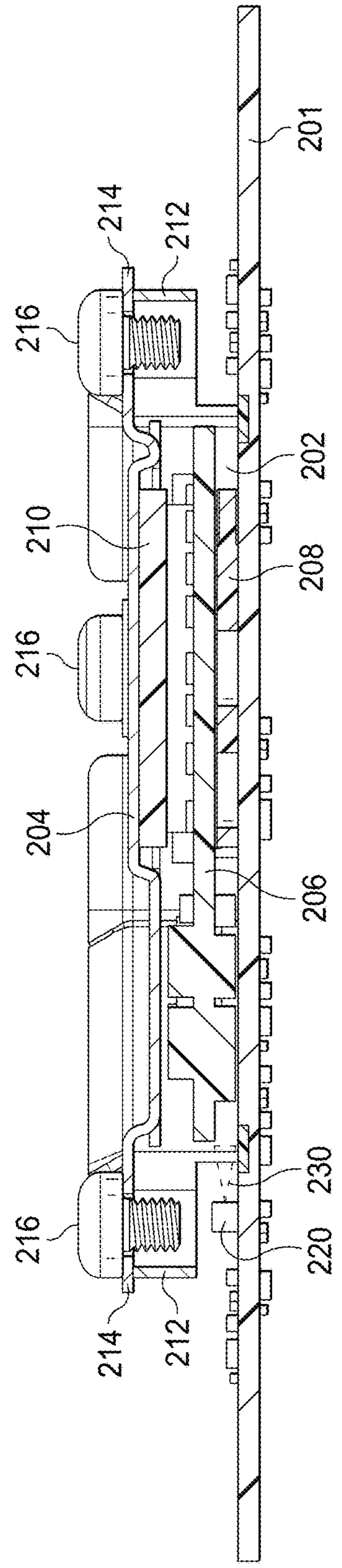
FIG. 2C illustrates a side elevation cross-sectional assembled view of the CAMM assembly shown in FIGS. 2A and 2B, in accordance with embodiments of the present disclosure.

Preferred embodiments and their advantages are best understood by reference to FIGS. 1 through 2C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of selected components of an example information handling system 102, in accordance with embodiments of the present disclosure. As depicted in FIG. 1, information handling system 102 may include a motherboard 101 housed within a chassis 100. Chassis 100 may be an enclosure that serves as a container for various information handling resources, and may be constructed from steel, aluminum, plastic, and/or any other suitable material. Although the term "chassis" is used, chassis 100 may also be referred to as a rack, case, cabinet, tower, box, enclosure, and/or housing. In certain embodiments, chassis 100 may be configured to hold and/or provide power to a plurality of information handling systems and/or information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103, memory 104, and one or more other information handling resources, mounted thereon.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102. Processor 103 may be mounted to motherboard 101 via a suitable connector or socket, and may be electrically coupled to motherboard 101 to enable communication of signals via motherboard 101 and enable processor 103 to receive electrical energy from motherboard 101 for powering processor 103.

Memory 104 may be communicatively coupled to processor 103 via motherboard 101 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. Modules implementing memory 104 may be mounted to motherboard 101 via suitable connectors or sockets, and may be electrically coupled to motherboard 101 to enable communication of signals via motherboard 101 and enable memory 104 to receive electrical energy from motherboard 101 for powering memory 104. In some embodiments, memory 104 may be implemented using one or more CAMMs.

In addition to motherboard 101, processor 103, and memory 104, information handling system 102 may include one or more other information handling resources.

FIG. 2A illustrates an isometric exploded view of a CAMM assembly 200, in accordance with embodiments of the present disclosure. FIG. 2B illustrates an isometric assembled view of CAMM assembly 200, in accordance with embodiments of the present disclosure. FIG. 2C illustrates a side elevation cross-sectional assembled view of CAMM assembly 200, in accordance with embodiments of the present disclosure.

As shown in FIGS. 2A-2C, CAMM assembly 200 may include circuit board 201, shield base 202, shield cap 204, CAMM 206, connector 208, thermal pad 210, a plurality of mechanical fasteners 216, and metal cladding 218.

Circuit board 201 may comprise any suitable printed circuit board, printed wiring board, or other circuit board. In some embodiments, circuit board 201 may implement motherboard 101 of information handling system 102.

Shield base 202 may be soldered to or otherwise mechanically mounted to circuit board 201 at a desired location upon a surface of circuit board 201. As shown in FIGS. 2A-2C, shield base 202 may have sidewalls that extend a height above the surface of circuit board 201 upon which shield base 202 is mounted. In some embodiments, shield base 202 may be shaped similar to a shape of a circuit board integral to CAMM 206. Shield base 202 may be made of metal or any other suitable material. As shown in FIGS. 2A-2C, shield base 202 may include a plurality of threaded inserts 212. Each threaded insert 212 may be configured to receive a corresponding screw or other mechanical fastener (e.g., one of mechanical fasteners 216). Further, as shown in FIG. 2C, at least one threaded insert 212 may be formed within shield base 202 such that when shield base 202 is mounted to circuit board 201, significant space remains between a bottom of the at least one threaded insert 212 and the surface of circuit board 201 to which shield base 202 is mounted, thus leaving room for circuit board routing under the at least one threaded insert and/or placement of a component on circuit board 201 under the at least threaded insert. In addition, as shown in FIGS. 2A-2C, the top of shield base 202 (e.g., the end of shield base 202 opposite of where shield base 202 mounts to circuit board 201) may be sloped or flared to guide components of CAMM 206 inserted into the space within the sidewalls of shield base 202.

Shield cap 204 may comprise metal or other suitable material, and may be shaped similar to a shape of a circuit board integral to CAMM 206 and/or similar to a shape of shield base 202. As shown in FIGS. 2A-2C, shield cap 204 may be predominantly a sheet of metal or other material, and may have extending from a perimeter of such sheet a plurality of tabs 214, each tab 214 including an opening capable of receiving therethrough a screw or other fastener (e.g., one of mechanical fasteners 216). Accordingly, shield cap 204 may be mechanically coupled to shield base 202 by placing shield cap 204 on top of shield base 202, and mechanically engaging each of the plurality of mechanical fasteners 216 with a respective opening formed in a respective tab 214 and with a respective threaded insert 212.

CAMM 206 may comprise any suitable memory module that may be electrically coupled to circuit board 201 via connector 208 by applying a mechanical pressure between CAMM 206 and circuit board 201. CAMM 206 may be implemented with a circuit board having one or more integrated circuits mounted on a first surface of such circuit board and having one or more electrical pins extending from a second surface of such circuit board. CAMM 206 may implement all or part of memory 104 of information handling system 102.

Connector 208 may comprise any suitable compression connector configured to, as a mechanical force is applied between CAMM 206 and circuit board 201 with connector 208 interfaced between, electrically couple pins of CAMM 206 to respective pads and traces of circuit board 201.

Thermal pad 210 may comprise any suitable system, device, or apparatus configured to transfer heat generated by CAMM 206 to shield cover 204. Furthermore, in addition or alternatively, thermal pad 210 may be configured (e.g., sized and/or shaped) to aid in providing mechanical force between CAMM 206 and circuit board 201 when shield cover 204 is fully assembled to shield base 202.

A mechanical fastener 216 may comprise a mechanical screw or other fastener.

Metal cladding 218 may include a trace of copper or metal deposited or otherwise formed on the surface of circuit board 201 and shaped in a manner similar to the shape of the edge of shield base 202 that couples to circuit board 201. For example, when shield base 202 is coupled to circuit board 201, metal cladding 218 may contour around shield base 202.

To assemble CAMM assembly 200, after shield base 202 is mechanically coupled to circuit board 201, connector 208 may be placed within shield base 202 and upon circuit board 201. Then CAMM 206 may be placed upon connector 208, and thermal pad 210 may be placed upon CAMM 206. Next, shield cap 204 may be placed over thermal pad 210 and on top of shield base 202, such that connector 208, CAMM 206, and thermal pad 210 are enclosed within a space defined by circuit board 201, shield base 202, and shield cap 204. With shield cap 204 properly aligned on top of shield base 202, each of the plurality of mechanical fasteners 216 may be mechanically engaged with a respective opening within a respective tab 214 and mechanically engaged with a respective threaded insert 212, creating a compressive force between circuit board 201 and shield cap 204, which in turn creates a compressive force among the various components of CAMM assembly 200, including compressive forces of CAMM 206 to connector 208 and connector 208 to circuit board 201, thus electrically coupling CAMM 206 to circuit board 201.

Such compressive force may also create compressive forces of CAMM 206 to thermal pad 210 and thermal pad 210 to shield cap 204, thus thermally coupling CAMM 206 to shield cap 204, such that heat generated by CAMM 206 may be transferred through thermal pad 210 to shield cap 204. Thus, in addition to providing compressive forces for electrically coupling CAMM 206 to circuit board 201, CAMM assembly 200 may also aid in cooling of components of CAMM 206.

Metal cladding 218 contoured around shield base 202 may also provide stitching to augment adhesion of shield base 202 to circuit board 201, for example to counteract any compression pulling forces exerted by connector 208.

Further, in embodiments in which shield base 202 and/or shield cap 204 are made of metal, CAMM assembly 200 may aid in shielding CAMM 206 from electromagnetic interference.

As shown in FIGS. 2B and 2C, in some embodiments, shield base 202 may include one or more openings 230 therethrough. As also shown in FIGS. 2B and 2C, an optical sensor 220 may be mounted to circuit board 201 proximate to opening 230 and may be configured to emit light at one or more desired wavelengths through opening 230 and into the interior of shield base 202 and further sense the amount of such emitted light that is reflected back to optical sensor 220. When CAMM assembly 200 is assembled correctly, the amount of sensed reflected light may fall within a particular range, and thus if the sensed reflected light is outside of such range, it may be indicative that CAMM assembly 200 is not properly assembled.

As also shown in FIG. 2B, a user interface 222 may also be mounted to circuit board 201 and communicatively coupled to optical sensor 220. Accordingly, a user may interact with user interface 222 to activate optical sensor 220 to test whether CAMM assembly 200 is assembled correctly. For example, a user may push a button 224 on user interface 222 to activate optical sensor 220 to emit and sense light, and visual indicators 226 and/or 228 (e.g., light-emitting diodes) may indicate to the user the result of the test (e.g., visual indicator 226 illuminated to indicate a positive test, visual indicator 228 illuminated to indicate a negative test).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
- a circuit board;
- a shield base mounted to a surface of the circuit board;
- a compression connector housed within the shield base and placed on the surface;
- a compression-attached memory module housed within the shield base and placed on the compression connector; and
- a shield cap mechanically coupled to the shield base to cause compressive mechanical force between the shield cap and the circuit board which in turn causes compressive mechanical force among the compression-attached memory module, the compression connector, and the circuit board in order to electrically couple the compression-attached memory module to the circuit board.

2. The information handling system of claim 1, further comprising a thermal pad housed within the shield base and placed on the compression-attached memory module, such that the compressive mechanical force between the shield cap and the circuit board further causes compressive mechanical force among the compression-attached memory module, the thermal pad, and the shield cap, in order to mechanically couple the compression-attached memory module to the circuit board.

3. The information handling system of claim 1, wherein:
- the shield base comprises a plurality of threaded inserts;
- the shield cap comprises a plurality of openings; and
- the shield cap is mechanically coupled to the shield base via a plurality of mechanical fasteners, wherein each mechanical fastener of the plurality of mechanical fasteners passes through a respective opening of the plurality of openings and mechanically engages with a respective threaded insert of the plurality of threaded inserts.

4. The information handling system of claim 3, wherein the plurality of threaded inserts are separated in space from the surface.

5. The information handling system of claim 2, further comprising an optical sensor mounted on the surface and configured to:
- emit light through an opening in the shield base; and
- detect an amount of the light reflected back to the optical sensor through the opening in the shield base.

6. The information handling system of claim 5, further comprising a user interface configured to:
- receive input from a user for activating the optical sensor; and
- provide a visual indication regarding the amount of light reflected back to the optical sensor.

7. An assembly comprising:
- a shield base configured to:
- mount to a surface of a circuit board;
- house a compression connector within the shield base;
- house a compression-attached memory module within the shield base; and
- a shield cap configured to mechanically couple to the shield base to cause compressive mechanical force between the shield cap and the circuit board to cause compressive mechanical force among the compression-attached memory module, the compression connector, and the circuit board in order to electrically couple the compression-attached memory module to the circuit board.

8. The assembly of claim 7, wherein:
- the shield base is further configured to house a thermal pad within the shield base; and the compressive mechanical force between the shield cap and the circuit board causes compressive mechanical force among the compression-attached memory module, the thermal pad, and the shield cap, in order to mechanically couple the compression-attached memory module to the circuit board.

9. The assembly of claim 7, wherein:

the shield base comprises a plurality of threaded inserts;

the shield cap comprises a plurality of openings; and the shield cap is configured to mechanically couple to the shield base via a plurality of mechanical fasteners, wherein each mechanical fastener of the plurality of mechanical fasteners is configured to pass through a respective opening of the plurality of openings and mechanically engage with a respective threaded insert of the plurality of threaded inserts.

10. The assembly of claim 9, wherein the plurality of threaded inserts are configured to be separated in space from the surface when the shield base is mechanically coupled to the circuit board.

11. The assembly of claim 7, wherein the shield base comprises an opening formed therein and is configured to receive light emitted from an optical sensor.

12. A method comprising:

mounting a shield base to a surface of a circuit board, the shield base configured to:

house a compression connector within the shield base;

house a compression-attached memory module within the shield base; and mechanically couple to a shield cap to cause compressive mechanical force between the shield cap and the circuit board to cause compressive mechanical force among the compression-attached memory module, the compression connector, and the circuit board in order to electrically couple the compression-attached memory module to the circuit board.

13. The method of claim 12, wherein:

the shield base is further configured to house a thermal pad within the shield base; and the compressive mechanical force between the shield cap and the circuit board causes compressive mechanical force among the compression-attached memory module, the thermal pad, and the shield cap, in order to mechanically couple the compression-attached memory module to the circuit board.

14. The method of claim 12, wherein:

the shield base comprises a plurality of threaded inserts;

the shield cap comprises a plurality of openings; and the shield cap is configured to mechanically couple to the shield base via a plurality of mechanical fasteners, wherein each mechanical fastener of the plurality of mechanical fasteners is configured to pass through a respective opening of the plurality of openings and mechanically engage with a respective threaded insert of the plurality of threaded inserts.

15. The method of claim 14, wherein the plurality of threaded inserts are separated in space from the surface when the shield base is mounted to the circuit board.

16. The method of claim 12, further comprising mounting an optical sensor mounted to the surface and configured to:

emit light through an opening in the shield base; and detect an amount of the light reflected back to the optical sensor through the opening in the shield base.

17. The method of claim 16, further comprising mounting a user interface to the circuit board configured to:

receive input from a user for activating the optical sensor; and provide a visual indication regarding the amount of light reflected back to the optical sensor.

* * * * *